United States Patent [19]

Abramovici et al.

[11] Patent Number: 5,559,811
[45] Date of Patent: Sep. 24, 1996

[54] METHOD FOR IDENTIFYING UNTESTABLE AND REDUNDANT FAULTS IN SEQUENTIAL LOGIC CIRCUITS.

[75] Inventors: Miron Abramovici, Murray Hill; Mahesh A. Iyer, Cranbury, both of N.J.

[73] Assignee: Lucent Technologies Inc., Murray Hill, N.J.

[21] Appl. No.: 599,289

[22] Filed: Feb. 9, 1996

Related U.S. Application Data

[63] Continuation of Ser. No. 366,075, Dec. 29, 1994, abandoned, which is a continuation-in-part of Ser. No. 306,088, Sep. 14, 1994.

[51] Int. Cl.$^6$ .................................................. G01R 31/28
[52] U.S. Cl. ................................................................ 371/27
[58] Field of Search .......................................... 371/23, 27

[56] References Cited

U.S. PATENT DOCUMENTS

| | | | |
|---|---|---|---|
| 4,716,564 | 12/1987 | Hung et al. | 371/27 |
| 4,862,399 | 8/1989 | Freeman | 364/580 |
| 5,257,268 | 10/1993 | Agrawal et al. | 371/27 |
| 5,291,495 | 3/1994 | Udell, Jr. | 371/22.3 |
| 5,331,570 | 7/1994 | Bershteyn | 364/489 |
| 5,377,197 | 12/1994 | Patel et al. | 371/22.3 |
| 5,410,552 | 4/1995 | Hosokawa | 371/27 |

OTHER PUBLICATIONS

M. H. Schulz and E. Auth, "Essential: An Efficient Self--Learning Test Pattern Generation Algorithm For Sequential Circuits," *IEEE 1989 International Test Conference*, pp. 2.3, pp. 28–37.

R. Razdan et al., "An Interactive Sequential Test Pattern Generation System," *IEEE 1989 International Test Conference*, Paper 2.4, pp. 38–46.

Friedman, A. D., "Fault Detection in Redundant Circuits," *IEEE Trans. on Electronic Computers*, vol. EC–16, pp. 99–100, Feb., 1967.

Abramovici, M. and M. A. Iyer, "One–Pass Redundancy Identification and Removal," *Proc. Intn'l Test Conf.*, pp. 807–815, Sep. 1992.

(List continued on next page.)

*Primary Examiner*—Vincent P. Canney
*Attorney, Agent, or Firm*—Kenneth M. Brown

[57] ABSTRACT

A method of identifying redundant and untestable faults in a sequential logic circuit. A lead in the circuit is selected and the circuit is analyzed to determine which faults would be hypothetically undetectable at a given time frame if the selected circuit lead were unable to assume a logic 0 at a starting time frame, and which faults would be hypothetically undetectable at the given time frame if the selected circuit lead were unable to assume a logic 1 at the starting time frame. Faults that would be undetectable at the given time frame in both hypothetical cases are identified as redundant and untestable faults. This analysis may be repeated for each of a plurality of time frames in a range of time frames which includes the starting time frame. Faults whose detection would not be possible if the selected lead were unable to assume a given value at the starting time frame may be determined based on a sequential implication procedure comprising the propagation of uncontrollability indicators and the backward propagation of unobservability indicators. An uncontrollability indicator for the given (0 or 1) value is assigned to the selected circuit lead and is propagated through the circuit and/or through a range of time frames according to a predetermined set of propagation rules. Unobservability indicators are generated in the circuit at various time frames based on the uncontrollability indicators, and these unobservability indicators are then propagated backward through the circuit and/or backward through the range of time frames, also in accordance with a predetermined set of propagation rules. The hypothetically undetectable faults are then determined based on the resultant indicators and their corresponding circuit leads and associated time frames.

24 Claims, 8 Drawing Sheets

OTHER PUBLICATIONS

Harihara, M. and P. R. Menon, "Identification of Undetectable Faults in Combinational Circuits," *Proc. Intn'l Conf. on Computer Design*, pp. 290–293, Oct. 1989.

Menon, P. R. and H. Ahuja, "Redundancy Removal and Simplification of Combinational Circuits," *Digest of Papers*, IEEE VLSI Test Symposium, pp. 268–273, Apr. 1992.

Giraldi, J. and M. L. Bushnell, "Search State Equivalence for Redundancy Identification and Test Generation," *Proc. Intn'l Test Conf.*, pp. 184–193, Oct. 1991.

Abramovici, M., J. J. Kulikowski and R. K. Roy, "The Best Flip–Flops to Scan," *Proc. Intn'l Test Conference*, pp. 166–173, Oct. 1991.

Brglez, F., D. Bryan, and K. Kozminski, "Combinational Profiles of Sequential Benchmark Circuits," *Proc. 1989 Intn'l Symposium on Circuits and Systems*, pp. 1929–1934, May 1989.

Abramovici, M., J. J. Kulikowski, P. R. Menon, and D. T. Miller, "Smart and Fast: Test Generation for VLSI Scan–Design Circuits," *IEEE Design and Test of Computers*, pp. 43–54, Aug. 1986.

Abramovici, M., D. T. Miller, and R. K. Roy, "Dynamic Redundancy Identification in Automatic Test Generation," *IEEE Trans. on CAD*, pp. 404–407, Mar. 1992.

Chakradhar, S. T., V. D. Agrawal, and S. G. Rothweiler, "A Transitive Closure Algorithm for Test Generation," *IEEE Trans. on CAD*, vol. 12, No. 7 pp. 1015–1028, Jul. 1993.

Kunz, W. and D. K. Pradhan, "Recursive Learning: An Attractive Alternative to the Decision Tree for Test Generation in Digital Circuits," *Proc. Intn'l Test Conf.*, pp. 816–825, Sep. 1992.

Agrawal, V. D. and S. T. Chakradhar, "Combinational ATPG Theorems for Identifying Untestable Faults in Sequential Circuits," *Proc. European Test Conf.*, pp. 249–253, April 1993.

Abramovici, M. and M. A. Breuer, "On Redundancy and Fault Detection in Sequential Circuits," *IEEE Trans. on Computers*, vol. C–28, pp. 864–865, Nov. 1979.

Davidson, S., "Is $I_{DDQ}$ Yield Loss Inevitable:" *Proc. Intn'l Test Conf.*, Oct. 1994, pp. 572–579.

Cheng, K. T., "On Removing Redundancy in Sequential Circuits," *Proc. 28th Design Automation Conf.*, pp. 164–169, Jun., 1991.

Cheng, K. T., "An ATPG–Based Approach to Sequental Logic Optimization," *Proc. Intn'l Conf. on Computer Aided Design*, pp. 372–375, 1991.

Cho, H., G. D. Hachtel and F. Somenzi, "Redundancy Identification/Removal and Test Generation for Sequential Circuits Using Implicit State Enumeration," *IEEE Trans. on CAD*, vol. 12, No. 7, 935–945, Jul. 1993.

Moondanos, J. and J. A. Abraham, "Sequential Redundancy Identification Using Verification Techniques," *Proc. Intn'l Test Conf.*, pp. 197–205, Sep. 1992.

Iyer, M. A. and M. Abramovici, "Low–Cost Redundancy Identification for Combinational Circuits," *Proc. 7th Intn'l Conf. VLSI Design, India*, pp. 315–318, Jan. 1994.

Pomeranz, I. and S. M. Reddy, "The Multiple Observation Time Test Strategy," *IEEE Trans. on Computers*, vol. 41, No. 5, pp. 627–637, May 1992.

Pomeranz, I. and S. M. Reddy, "Classification of Faults in Synchronous Sequential Circuits," *IEEE Trans. on Computers*, vol. 42, No. 9, Sep. 1993, pp. 1066–1077.

Pomeranz, I. and S. M. Reddy, "On Identifying Undetectable and Redundant Fault in Synchronous Sequential Circuits," *12th IEEE VLSI Test Symposium*, pp. 8–14, Apr. 1994.

Ibarra, O. H. and S. K. Sahni, "Polynomially Complete Fault Detection Problems," *IEEE Trans. on Computers*, vol. C–24, pp. 242–249, Mar. 1975.

Chakraborty, T. J., S. Davidson, and B. Bencivenga, "The Architecture of the GenTest Sequential Circuit Test Generator," *Proc. IEEE Custom Integrated Circuits Conference*, May 1991, pp. 17.1.1–17.1.4.

Iyer, M. A. and M. Abramovici, "Sequentially Untestable Faults Identified Without Search (Simple Implications Best Exhaustive Search!)," *Proc. Intn'l Test Conf.*, pp. 259–266, Oct. 1994.

Pomeranz, I. and S. M. Reddy, "On Achieving Complete Testability of Synchronous Sequential Circuits with Synchronous Sequential," *Proc. Intnl. Test Conf.*, pp. 1007–1016, Oct., 1994.

Entrena, L. and K. T. Cheng, "Sequential Logic Optimization By Redundancy Addition and Removal," *Proc. Intn'l Conf. on CAD*, pp. 310–315, Nov. 1993.

Abramovici, M. and M. A. Breuer, and A. D. Friedman, *Digital Systems Testing and Testable Design*, IEEE Press, 1994.

Pomeranz, I., S. M. Reddy and J. H. Patel, "Theory and Practice of Sequential Machine Testing and Testability," *Proc. 22nd. Fault Tolerant Computing Symp.*, pp. 1–8, 1993.

Abramovici, M. and P. S. Parikh, "Warning: 100% Fault Coverage May be Misleading!!" *Proc. Intnl. Test Conf.*, pp. 662–668, Sep. 1992.

Gupta, R. R. Gupta and M. A. Breuer, "The Ballast Methodology for Structured Partial Scan," *IEEE Trans. on Computers*, pp. 538–544, Apr. 1990.

Leiserson, C. E. and J. B. Saxe, "Retiming Synchronous Circuiry," *Algorithmica*, vol. 6, pp. 5–35, 1991.

Dey, S. and S. T. Chakradhar, "Retiming Sequential Circuits to Enhance Testability," *12th IEEE VLSI Test Symposium*, pp. 28–33, Apr. 1994.

METHOD FOR IDENTIFYING UNTESTABLE AND REDUNDANT FAULTS IN SEQUENTIAL LOGIC CIRCUITS.

CROSS-REFERENCE TO RELATED APPLICATION

This application is a continuation of application Ser. No. 08/366075 filed Dec. 29, 1994, now abandoned, which is a continuation-in-part of application Ser. No. 08/306088 filed Sep. 14, 1994.

FIELD OF THE INVENTION

The present invention relates generally to the field of automatic test generation (ATG) for sequential digital logic circuits and more particularly to the identification of redundant and untestable faults in such circuits.

BACKGROUND OF THE INVENTION

The problem of adequately testing digital logic circuits has grown substantially more complex over the years with the rapid increase in the complexity of the logic circuits being designed and fabricated. Most modern approaches to this problem involve the use of automatic test generation (ATG) systems which are charged with the task of automatically generating a comprehensive test plan for a given circuit design. Such an ATG system is provided with a description of the circuit design, typically in terms of its constituent circuit elements (e.g., logic gates) and the interconnections among those elements and to the circuit's primary inputs and primary outputs. The ATG system then automatically generates circuit stimuli which, when applied to the primary inputs of a fabricated instance of the given circuit design, will result in a response at the circuit's primary outputs which will identify (with a reasonable degree of certainty) whether the fabricated circuit is operating in accordance with the given circuit design.

Since the number of possible malfunctions which a fabricated circuit may theoretically exhibit is extremely large, ATG systems typically perform their task (and measure the quality of their result) based on a fault "model" in which only a comparatively small number of possible malfunctions are considered. The most common such model, the "stuck-at" fault model, enumerates the set of malfunctions in which each circuit lead (i.e., each input to and each output from a circuit element) may be individually "stuck" at one of its possible values (e.g., logic 0 or logic 1). In this manner, the number of possible faults to be considered is limited to twice the number of circuit leads. The "stuck-at" fault model has become well accepted as providing a reasonable correspondence to the set of likely physical errors which typically result from the fabrication process.

Most ATG systems select one of the modelled faults at a time, and attempt to generate tests (i.e., circuit stimuli) which will be able to "detect" that fault. That is, the system's goal is to find circuit stimuli which, when applied to the primary inputs of a "defective" circuit (i.e., one which has the given fault), will result in a response at the circuit's primary outputs which differs from that of a properly operational circuit. Usually, these circuit stimuli are generated as a result of an exhaustive search procedure involving substantial trial and error. For most typical circuit designs, however, quite a few of the faults may, if actually present in a fabricated instance of the circuit, cause no discernable change in the circuit behavior at all. These faults are, therefore, undetectable or unrestable. (In fact, they often reflect an inherent logic redundancy in the circuit design.) Thus, absent some means of identifying untestable faults, most ATG systems will identify such faults as untestable only after exhausting the search space being examined. Therefore, a large portion of an ATG system's time (if not most of it) may be spent in futile attempts to generate tests for untestable faults.

Although prior art techniques which eliminate some untestable faults have been used, these techniques typically eliminate only a small portion of all untestable faults. In particular, a conventional circuit lead "controllability" and "observability" analysis may be performed to identify circuit leads which either cannot be set to a given logic value (i.e., are uncontrollable to that value), or whose value cannot be observed at the circuit's primary outputs. As a result of such an analysis, a limited number of untestable faults can be identified. However, the identification of the vast majority of untestable faults is not so simple. Most untestable faults occur due to more complex circuit redundancies in which all of the relevant circuit leads are individually controllable to both logic values and are also observable at the circuit's primary outputs.

In addition to the above described test generation problems, the need for logic circuits of increasing complexity also make the designer's task more difficult. In particular, it is highly desirable that circuits are designed as efficiently as possible, and yet initial circuit designs often contain redundant circuitry whose elimination would have no effect on the circuit's behavior. It is often difficult for the circuit designer to identify such redundant portions of the circuit manually.

SUMMARY OF THE INVENTION

In accordance with the present invention, a method of identifying redundant and untestable faults in a sequential logic circuit is provided. Specifically, a lead in the circuit is selected and the circuit is analyzed to determine which faults would be hypothetically undetectable at a given time frame if the selected circuit lead were unable to assume a first value (e.g., a logic 0) at a starting time frame, and which faults would be hypothetically undetectable at the given time frame if the selected circuit lead were unable to assume a second value (e.g., a logic 1) at the starting time frame. Then, faults that would be undetectable at the given time frame in both hypothetical cases are identified as redundant and untestable faults. The above analysis may advantageously be repeated for each of a plurality of time frames in a range of time frames including a starting time frame. The time frames may, for example, comprise the blocks of a conventional combinational iterative array circuit model of the sequential logic circuit.

The selected circuit lead may, for example, be a circuit line stem (e.g., a fanout point) or a reconvergent input of a reconvergent circuit element (e.g., gate). Advantageously, the method of the present invention may be repeated for each such circuit line stem and each such reconvergent input of a reconvergent gate in order to identify most, if not all, of the untestable faults for the given logic circuit.

In accordance with one embodiment of the present invention, the faults which would be hypothetically undetectable at a given time frame if the selected lead were unable to assume a given one of the first and second values at a starting time frame may be determined based on a sequential implication procedure. This implication procedure comprises the propagation of uncontrollability indicators and the backward propagation of unobservability indicators. In particular, an uncontrollability indicator for the given (first or second) value is assigned to the selected circuit lead and is propagated through the circuit and/or through a range of time frames according to a predetermined set of propagation rules. In addition, unobservability indicators are generated in the circuit at various time frames based on the uncontrollability indicators, and these unobservability indicators are then propagated backward through the circuit and/or backward through the range of time frames, also in accordance with a predetermined set of propagation rules. The hypothetically undetectable faults are then determined based on the resultant indicators and their corresponding circuit leads and associated time frames.

In accordance with an additional illustrative embodiment of the present invention, a sequential logic circuit design may be modified to remove logical redundancy. The method of the present invention is used to identify a redundant and untestable fault, and a portion of the circuit is removed based on the identified fault.

DETAILED DESCRIPTION

Figure 1:
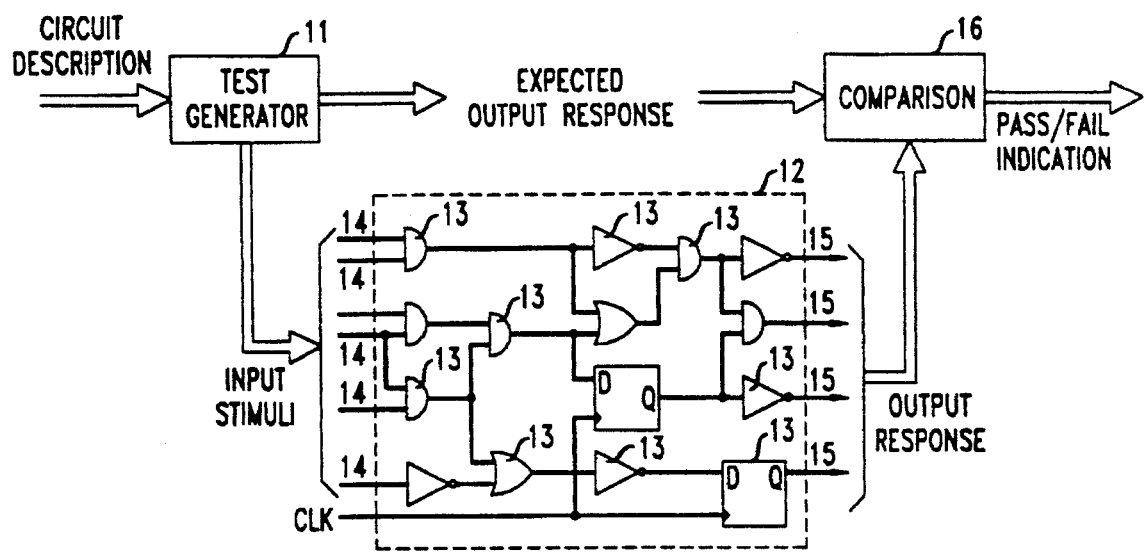
FIG. 1 shows an illustrative testing process for a logic circuit, the test having been generated by an illustrative embodiment of the method of the present invention.

FIG. 1 shows an illustrative testing process for a logic circuit, the test having been generated by an illustrative embodiment of the method of the present invention. In particular, test generator 11 generates input stimuli and a corresponding expected output response based on a circuit description of the circuit to be tested. Specifically, test generator 11 operates in accordance with an illustrative embodiment of the method of the present invention, as shown, for example, in FIG. 9, below. Test generator 11 may, for example, comprise a general purpose computer system and software executing thereon. Each fabricated instance of circuit 12 comprises a plurality of interconnected circuit elements 13 (e.g., gates and flip-flops), one or more primary inputs 14 and one or more primary outputs 15.

When a given fabricated instance of circuit 12 is to be tested, the input stimuli generated by test generator 11 is applied to primary inputs 14 of circuit 12, and the resultant output response is measured on primary outputs 15. The resultant output response is compared with the expected output response (which was generated by test generator 11) by comparison circuit 16, thereby identifying faulty instances of the circuit. The testing process described herein is most commonly performed by a computer-controlled system known generically as Automatic Test Equipment (ATE). A typical ATE system comprises hardware components (in addition to the controlling computer) which are adapted to apply stimuli to a fabricated instance of a circuit, measure the responses from the fabricated instance of the circuit, and compare the measured response to a predetermined expected response. The fabricated instance of the circuit to be tested is usually "plugged into" the ATE system by means of a standardized interface.

Figure 2:
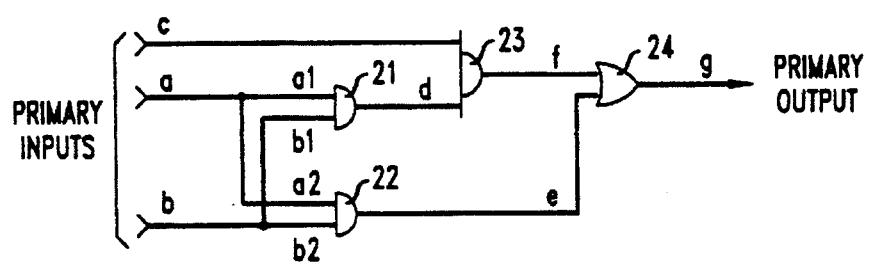
FIG. 2 shows an example combinational circuit having untestable faults.

FIG. 2 illustrates an example combinational circuit having untestable faults. The example circuit comprises "And" gates 21, 22 and 23 and "Or" gate 24 interconnected to each other and to primary inputs a, b and c and to primary output g. Consider the fault f stuck-at-0, where the first input lead to "Or" gate 24 is permanently fixed to a logic 0 value. (Note that in a case such as this where a circuit line contains no fanout, there is no meaningful distinction between a stuck-at fault at the output lead of the driving gate and the corresponding stuck-at fault at the input lead of the receiving gate.)

In order to detect (i.e., test for) a stuck-at fault (e.g., a stuck-at-0) at a given circuit lead, it is necessary that the given lead be "activated" to create a difference in value (e.g., 0 vs. 1) between the faulty circuit and the properly operational circuit, and, furthermore, that the resultant difference in value be "propagated" to a primary output of the circuit where it can be observed by the testing process. In order to activate a stuck-at fault on a given circuit lead, it is merely necessary to set the circuit lead to a logic value opposite to the stuck-at value. For example, the lead must be set to a logic 1 in order to detect a stuck-at-0 fault. In order to propagate a fault, a path from the given circuit lead to a primary output must be "sensitized"—that is, each gate along such a path must become sensitive to the value on the given path. This is achieved by setting the values on all of the other inputs of these gates to appropriate values. (For example, to sensitize the path from an input of either a "Nand" or "And" gate to its output, all of the other inputs must be set to logic 1 values.)

Thus, in order to detect the fault f stuck-at-0, it is first necessary that circuit leads c and d be set to a logic 1, and, by implication, it is necessary that both circuit leads a and b be set to a logic 1. However, in order to propagate the f stuck-at-0 fault effect from f to a primary output, circuit lead e must be set to a logic 0 (since only when lead e is a logic 0 will "Or" gate 24 be sensitized to allow the logic value on lead f to propagate to primary output g). Thus, by implication, at least one of circuit leads a and b must be set to a logic 0. This contradiction (i.e., both circuit leads a and b are set to a logic 1 vs. at least one of circuit leads a and b must be set to a logic 0) shows that the fault f stuck-at-0 is necessarily untestable. In other words, in order to detect the fault f stuck-at-0, it is necessary that one of circuit leads a or b be simultaneously a logic 0 and a logic 1.

The above analysis consisted of a procedure similar to that typically performed by ATG systems. By attempting to devise a test for the fault f stuck-at-0, a conflict arose which could not be resolved. In more typical (i.e., more complex) circuits, such conflicts are often encountered, but are often resolvable by backtracking to points at which arbitrary decisions (i.e., choices) were made, and making an alternate decision at that point. (For example, the output of a "Nand" gate may be set to a logic 1 by setting any of its inputs to a logic 0.) In the case of the above analysis for the fault f stuck-at-0 in the example circuit of FIG. 2, there were no choices which could have been made in an alternative manner, and, thus, no backtracking was possible.

Figure 3:
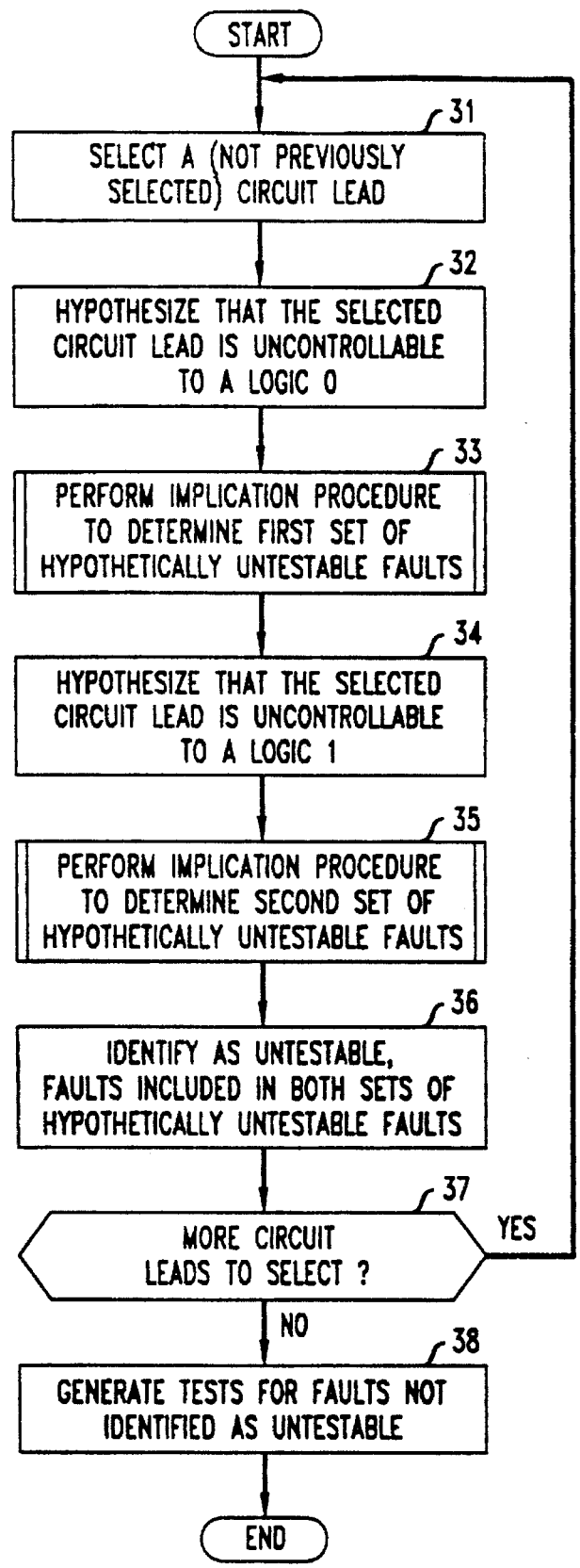
FIG. 3 shows a flowchart describing an illustrative method for identifying untestable faults in a combinational circuit.

FIG. 3 shows a flowchart describing an illustrative method for detecting untestable faults in combinational circuits such as the example circuit of FIG. 2. The illustrative procedure iteratively selects each of a plurality of the circuit leads in the circuit in turn. The procedure begins in step 31 by selecting one such (not previously selected) circuit lead for analysis. Advantageously, the selected leads may be limited to stems of circuit lines having reconvergent fanout (i.e., the outputs of gates which have fanout branches which proceed along paths that ultimately reconverge as inputs to another gate) and to reconvergent inputs of reconvergent gates, rather than selecting each and every circuit lead in the circuit in turn. This advantage results from the fact that conflicts which cause untestable faults can only result from reconvergent fanout structures. In one illustrative embodiment of method of the present invention, the selected leads are limited to only circuit line stems. By so limiting the selected leads, some of the untestable faults in a given circuit may not be identified. Nonetheless, such a limited approach typically identifies most of the untestable faults which would be identified by including the analysis of reconvergent inputs, while a significant reduction in computation time is achieved by analyzing only circuit line stems.

Once a given circuit lead is selected, step 32 of the illustrative procedure of FIG. 3 "marks" that circuit lead as being (hypothetically) uncontrollable to a logic 0 (i.e., unable to assume a logic 0 value, regardless of the values applied to the primary inputs of the circuit). Then, in step 33, an implication procedure is applied which marks other circuit nodes as uncontrollable to an appropriate logic value or unobservable (i.e., unable to have its value propagated to a primary output) as appropriate by implication from the originally hypothesized uncontrollability condition. Based on the resultant uncontrollability and unobservability indicators, a first set of hypothetically untestable faults may be deduced. (See discussion of the implication rules shown in FIG. 4 and discussion of the implication procedure of FIG. 5 below.)

Next, step 34 marks the selected circuit lead as being (hypothetically) uncontrollable to a logic 1 (i.e., unable to assume a logic 1 value). Then, in step 35, the implication procedure is again applied, thereby marking other circuit nodes as uncontrollable to an appropriate logic value or unobservable as appropriate by implication from the originally hypothesized uncontrollability condition. Based on this set of resultant uncontrollability and unobservability indicators, a second set of hypothetically untestable faults may be deduced.

Thus, two sets of hypothetically untestable faults have been deduced—a first set of faults each of which would be untestable if the selected circuit lead were uncontrollable to a logic 0, and a second set of faults each of which would be untestable if the selected circuit lead were uncontrollable to a logic 1. Since at any given point in time the selected circuit lead may only assume one of the two possible logic values, any fault which appears in both sets is necessarily untestable. The untestable faults which may be deduced based on the analysis of the selected circuit lead are identified in step 36 as those faults appearing in both sets. Decision 37 then determines if there are more circuit leads to select (e.g., whether all stems of circuit lines having reconvergent fanout and all reconvergent inputs of reconvergent gates have been analyzed) and repeats the above described procedure if there are more such leads to be analyzed. If there are no more circuit leads to analyze, step 38 performs the automatic test generation (ATG) process on the circuit, explicitly excluding those faults which have been identified as untestable by the procedure of steps 31 through 37. As described above, the ATG process of step 38 produces circuit stimuli and expected output responses.

Figure 4:
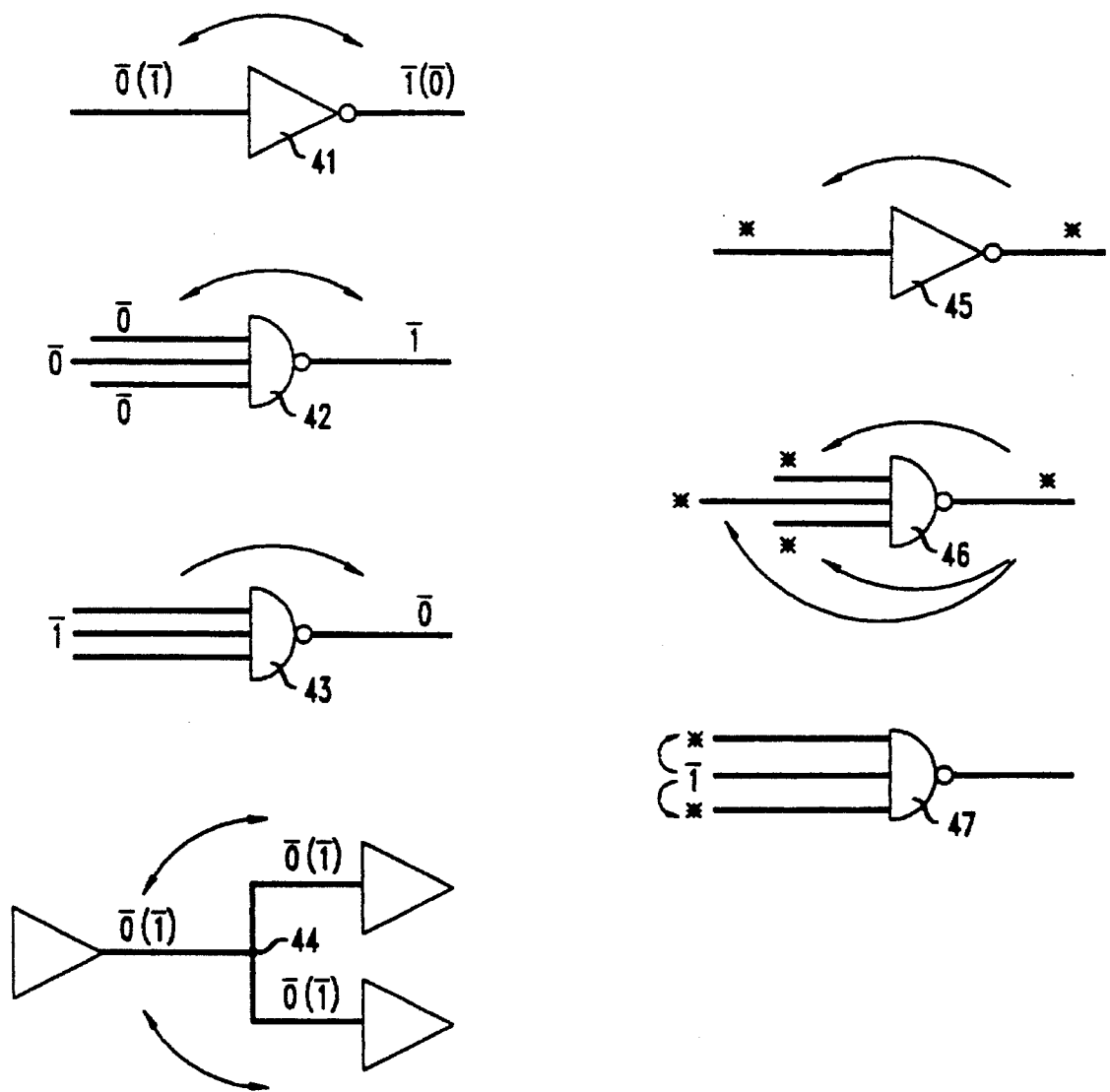
FIG. 4 shows selected illustrative rules for propagation of uncontrollability indicators and generation and backward propagation of unobservability indicators.

FIG. 4 shows certain illustrative rules for the propagation of uncontrollability indicators and backward propagation of unobservability indicators. These rules may be used by the illustrative implication procedure used in the procedure of FIG. 3 and shown in more detail in FIG. 5. Gates 41, 42 and 43 and circuit line fanout point 44 illustrate rules for the propagation of uncontrollability indicators, and gates 45, 46 and 47 illustrate rules for backward propagation of unobservability indicators. By convention, "$\overline{0}$" will be used to denote the status of a circuit lead that is (hypothesized to be) uncontrollable to the logic value 0. Similarly, "$\overline{1}$" will be used to denote the status of a circuit lead that is (hypothesized to be) uncontrollable to the logic value 1. In addition, "*" will be used to denote the status of a circuit lead that is (hypothesized to be) unobservable.

Inverter gate 41, for example, shows that when an inverter gate's input is marked with a "$\overline{0}$," its output may be marked with a "$\overline{1}$." Similarly, when an inverter gate's input is marked with a "$\overline{1}$," its output may be marked with a "$\overline{0}$." Moreover, when an inverter gate's output is marked with a "$\overline{0}$," its input may be marked with a "$\overline{1}$," and when an inverter gate's output is marked with a "$\overline{1}$," its input may be marked with a "$\overline{0}$." These rules result from the obvious fact that if an inverter's input cannot be set to a given value, its output cannot be set to the opposite value, and vice versa.

"Nand" gate 42 shows that when all of a "Nand" gate's inputs are marked with a "$\overline{0}$," its output may be marked with a "$\overline{1}$," since if none of a "Nand" gate's inputs can be set to a logic 0, there is no way to set its output to a logic 1. Moreover, when a "Nand" gate's output is marked with a "$\overline{1}$," all of its inputs may be marked with a "$\overline{0}$," since if a "Nand" gate's output cannot be set to a logic 1, there must be no way to set any of its inputs to a logic 0. "Nand" gate 43 shows that when any of a "Nand" gate's inputs are marked with a "$\overline{1}$," its output may be marked with a "$\overline{0}$," since if any of a "Nand" gate's inputs cannot be set to a logic 1, there is no way to set its output to a logic 0.

And fanout point 44 shows that when a circuit line stem is marked with a "$\overline{0}$," each of its fanout branches may be marked with a "$\overline{0}$," and, similarly, when a circuit line stem is marked with a "$\overline{1}$," each of its fanout branches may be marked with a "$\overline{1}$," since a fanout branch can only be set to a given value by setting its corresponding stem to that value. Moreover, when each fanout branch of a circuit line stem is marked with a "$\overline{0}$," the stem may be marked with a "$\overline{0}$," and, similarly, when each fanout branch is marked with a "$\overline{1}$," the stem may be marked with a "$\overline{1}$," for the same reason. Similar rules for the propagation of uncontrollability indicators which may be applied to other gate types or combinational circuit elements will be obvious to those skilled in the art.

Inverter gate 45 shows that when an inverter gate's output is marked with a "*," its input may also be marked with a "*." "Nand" gate 46 shows that when a "Nand" gate's output is marked with a "*," each of its inputs may be marked with a "*." These rules result from the fact that if any gate's output cannot be observed, none of its inputs can be observed. And "Nand" gate 47 shows that when one of its inputs is marked with a "$\bar{1}$," each of its other inputs may be marked with a "*," since an input to a "Nand" gate can only be observed by setting all of the other inputs to a logic 1. Similar rules for the backward propagation of unobservability indicators which may be applied to other gate types or combinational circuit elements will also be obvious to those of ordinary skill in the art. (Note, however, that a circuit line stem can, in certain circumstances, be observable even if all of its fanout branches are not observable.)

Figure 5:
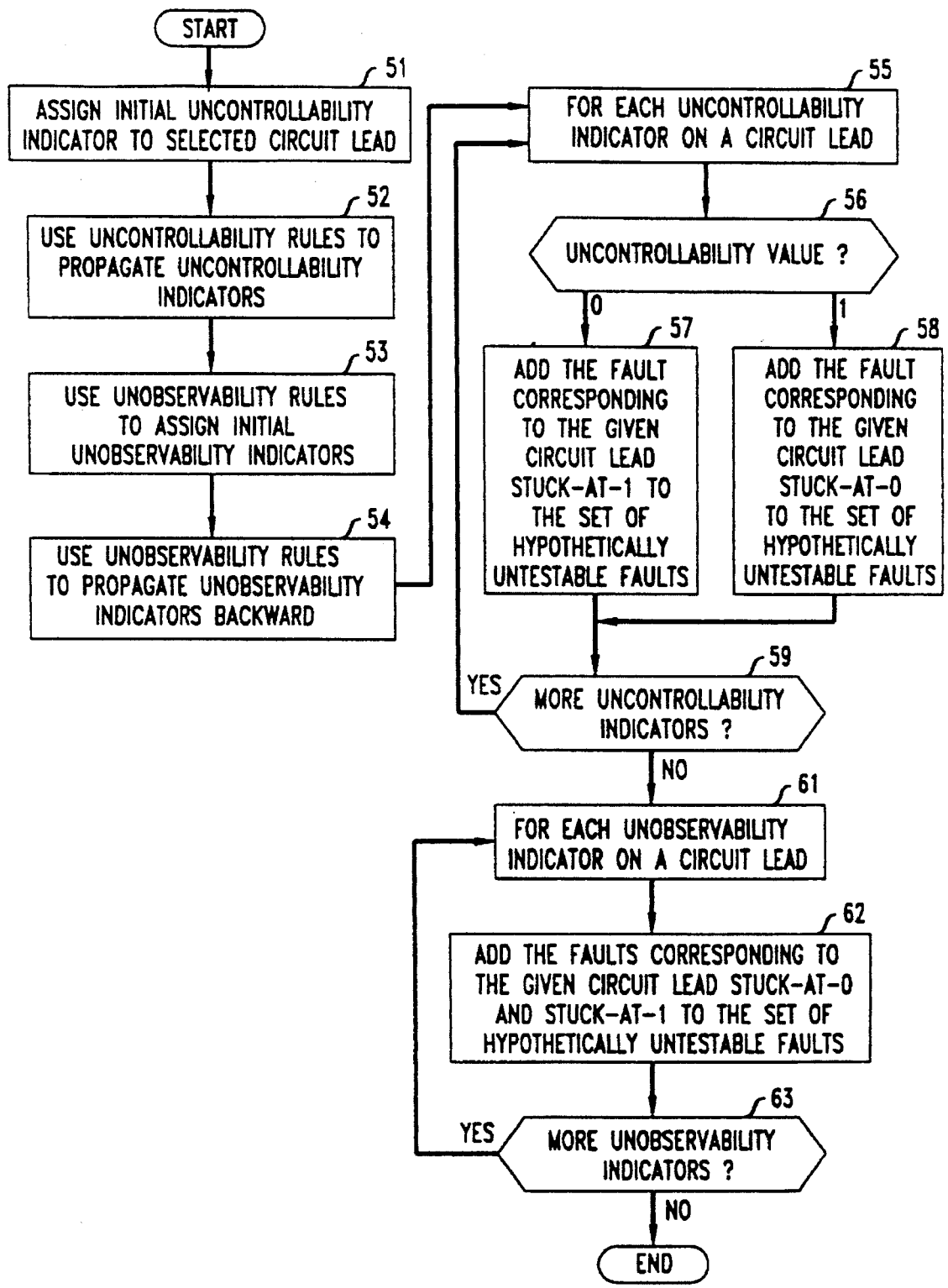
FIG. 5 shows a flowchart of an illustrative implication procedure for use in the illustrative procedure of FIG. 3.

FIG. 5 shows a flowchart of an illustrative implication procedure for use in steps 33 and 35 of the illustrative procedure of FIG. 3. Specifically, the procedure of FIG. 5 determines a set of faults that would (hypothetically) be untestable if a given, selected circuit lead were uncontrollable to a specified value. This illustrative procedure may, for example, use propagation rules such as those shown in FIG. 4 and described above.

Step 51 assigns an initial uncontrollability indicator to the selected circuit lead. This uncontrollability indicator marks the selected lead as uncontrollable to the specified logic value (0 or 1) depending on whether the procedure is being used to implement step 33 or step 35 of the procedure of FIG. 3. Next, step 52 uses predetermined uncontrollability indicator propagation rules (such as those shown on gates 41, 42 and 43 and circuit line fanout point 44 in FIG. 4) to propagate uncontrollability indicators through the circuit. Step 53 uses predetermined unobservability indicator creation rules (such as that shown on gate 47 in FIG. 4) to assign initial unobservability indicators to appropriate circuit leads. Step 54 then uses predetermined unobservability indicator propagation rules (such as those shown on gates 45 and 46 in FIG. 4) to propagate unobservability indicators backward through the circuit.

At this point, all circuit leads which can be implied to be uncontrollable and/or unobservable from the initial uncontrollability assumption (based on the predetermined set of rules) have been so marked. Thus it only remains to deduce the hypothetically untestable faults which result from the markings appearing on the various circuit leads. In particular, these are the faults that cannot be activated and the faults that cannot be propagated. The faults which (hypothetically) cannot be activated are the stuck-at-0 faults on leads which have been marked as uncontrollable to a logic 1 and the stuck-at-1 faults on leads which have been marked as uncontrollable to a logic 0. The faults which (hypothetically) cannot be propagated are both the stuck-at-0 and the stuck-at-1 faults on leads which have been marked as unobservable.

Thus, step 55 of the procedure of FIG. 5 chooses each circuit lead which has been marked with an uncontrollability indicator and, depending on the uncontrollability value with which it has been marked (as determined by decision 56), either the stuck-at-1 fault on that circuit lead (step 57) or the stuck-at-0 fault on that circuit lead (step 58) is added to the set of hypothetically untestable faults. Decision 59 returns to step 55 to choose another such circuit lead until each uncontrollabilty indicator has been processed.

Similarly, step 61 chooses each circuit lead which has been marked with an unobservability indicator, and step 62 adds both the stuck-at-0 fault and the stuck-at-1 fault on that circuit lead to the set of hypothetically untestable faults. Decision 63 returns to step 61 to choose another such circuit lead until each unobservability indicator has been processed.

Figure 6:
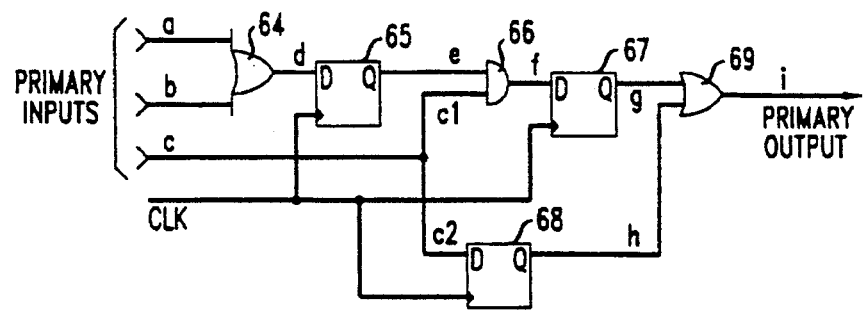
FIG. 6 shows an example sequential circuit having untestable faults.

Whereas the above discussion has heretofore been limited to techniques for the identification of untestable faults in combinational circuits, certain improvements may be made to these techniques (in accordance with the present invention) to produce similar techniques applicable to sequential circuits. FIG. 6 shows an example sequential circuit having untestable faults. The example circuit comprises "Or" gates 64 and 69, "And" gate 66 and "Flip-flop" elements 65, 67 and 68 interconnected to each other and to primary inputs a, b and c and to primary output i. "Flip-flops" 65, 67 and 68 are controlled by a common clock signal, CLK, as is typical for synchronous sequential circuits. With each operation of the clock signal (i.e., each clock pulse) a new "time frame" is entered. Each lead in the circuit can (at least in theory) assume a distinct logic value at each time frame. However, in a synchronous sequential circuit, only one such (stable) logic value may be assumed by a given circuit lead at each time frame. Thus, if the detection of a given fault requires that some circuit lead assume contradictory logic values at the same time frame, the fault is necessarily undetectable.

Consider, for example, the fault g stuck-at-0. In order to "activate" this fault at a given time frame (call it time "t"), it is necessary that circuit lead g assume the logic 1 value at time "t." This implies that circuit lead f is a logic 1 at the previous time frame (i.e., time "t–1") which, in turn, implies that both circuit leads e and c1 are logic 1 at time "t–1." Therefore circuit lead c must be a logic 1 at time "t–1." However, in order to propagate the hull g stuck-at-0, it is necessary that circuit lead h be a logic 0 at the time when the fault has been activated (i.e., time "t"). This, in turn, implies that circuit lead c2 be a logic 0 at the previous time frame (i.e., time "t–1"). Therefore, circuit lead c must be a logic 0 at time "t–1," contradicting the requirement that circuit lead c must be a logic 1 at time "t–1."

As can be seen from the above discussion with reference to FIG. 6, untestable faults may be identified in a synchronous sequential circuit by analyzing logic value assignments over a plurality of time frames. In particular, a fault can be determined to be untestable by performing such an analysis until a contradiction is reached. However, in a similar manner to the analysis described above with reference to the example combinational circuit of FIG. 2, the above analysis of the example sequential circuit of FIG. 6 employed a procedure similar to that typically performed by ATG systems—that is, such an analysis requires, in general, a time-consuming exhaustive search.

In accordance with an illustrative embodiment of the present invention, a method of identifying untestable faults in a sequential circuit determines faults the detection of which would require a selected circuit lead to simultaneously (i.e., at the same time frame) assume two distinct logic values. This illustrative method selects a circuit lead for analysis, and defines an arbitrary time frame (referred to herein as the starting time frame or time "0") at which time it is presumed that a conflict of logic value assignment at that circuit lead may hypothetically occur. Moreover, a predetermined range of time frames which includes the starting time frame is specified. Faults whose activation and/or propagation (at any one of these time frames) are determined to require such a conflict of assigned logic values on the selected lead at the starting time frame are identified. A fault whose activation and/or propagation at a given time frame requires such a conflict is said to be undetectable at the given time frame. However, since the starting time frame is chosen arbitrarily (i.e., the starting time frame can be any time frame), these faults are necessarily untestable.

Figure 7:
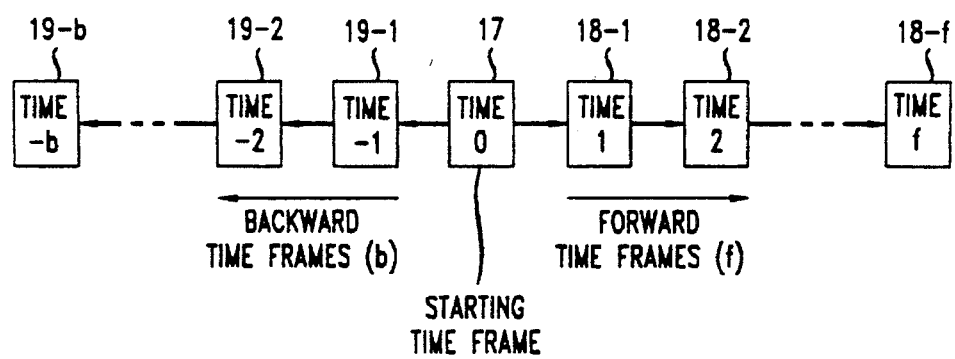
FIG. 7 illustrates a plurality of time frames through which an untestable fault analysis of a sequential circuit may be performed.

FIG. 7 illustrates a plurality of time frames through which such an analysis of a sequential circuit may be performed. In particular, starting time frame 17 is identified as time "0," which represents the time frame at which conflicts are (hypothetically) presumed to occur. Forward time frames 18-1 through 18-f represent a predetermined number of relative time frames ("f" time frames identified as time frame "1" through time frame "f") immediately subsequent to the starting time frame. Backward time frames 19-1 through 19-b represent a predetermined number of relative time frames ("b" time frames identified as time frame "–1" through time frame "–b") immediately prior to the starting time frame. Thus, a total of "f+b+1" time frames (time frame "–b" through time frame "f" inclusive), each identified based on its relative position to the starting time frame, will be considered.

Now consider, for example, the fault g stuck-at-0 in the example circuit of FIG. 6. As was seen from the analysis above, the activation of this fault at a given time frame "t" requires that circuit lead c be a logic 1 at time frame "t–1," while its propagation at that same time frame "t" requires that circuit lead c be a logic 0 at time frame "t–1." By hypothesizing the possibility of a conflict on circuit lead c at a starting time frame (i.e., time frame "0"), it can be determined (in accordance with an illustrative embodiment of the present invention) that the fault g stuck-at-0 is undetectable at (relative) time frame "1" without such a conflict being required. In other words, the detection of g stuck-at-0 requires a conflict on circuit lead c one time frame earlier than the time frame at which it is desired that the fault be activated and propagated. Thus, g stuck-at-0 is necessarily an untestable fault. A similar analysis, obvious to those skilled in the art, will apply to faults determined to be undetectable at other time frames relative to the starting time frame, including backward time frames "–b" to "–1."

Figure 8:
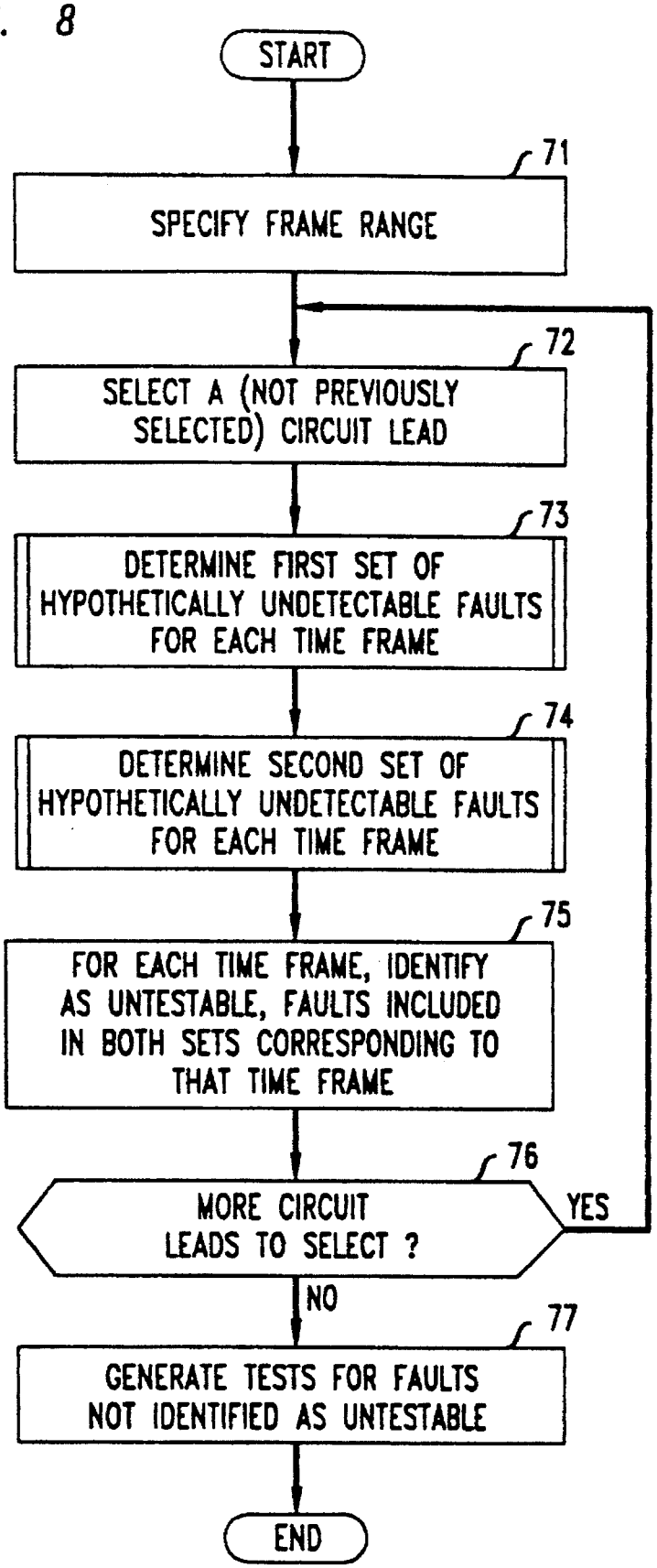
FIG. 8 shows a flowchart describing an illustrative embodiment of the method of the present invention for identifying untestable faults in sequential circuits.

FIG. 8 shows a flowchart describing an illustrative embodiment of the method of the present invention for identifying untestable faults in sequential circuits. First, step 71 specifies the time frame range for analysis. That is, a predetermined number of time frames subsequent to a starting time frame ("f") and a predetermined number of time frames prior to the starting time frame ("b"), such as is illustratively shown in FIG. 7, is specified. Thus, the total number of time frames which will be evaluated by the illustrative procedure of FIG. 8 is "f+b+1." These predetermined numbers ("f" and "b") may be fixed at constant values (e.g., five), or, in alternative embodiments, these numbers could be gradually increased while new untestable faults are found or until predefined maximum values (e.g., five) are reached.

Step 72 selects a (not previously selected) circuit lead for analysis. Step 73 determines a plurality of "first" sets of faults, one set for each of the "f+b+1" relative time frames, which would be (hypothetically) untestable if the selected circuit lead were uncontrollable to a logic 0 value at the starting time frame (i.e., time frame "0"). Similarly, step 74 determines a plurality of "second" sets of faults, one set for each of the "f+b+1" relative time frames, which would be (hypothetically) untestable if the selected circuit lead were uncontrollable to a logic 1 value at time flame "0." In particular, for each relative time flame, steps 73 and 74 each determine faults which either could not be activated at that time frame or, if activated, could not be propagated at that time flame, given the hypothetical assumption that the selected circuit lead cannot assume the corresponding logic value at time flame "0." Step 75 then identifies as untestable the faults which are included in both the first and second sets of hypothetically untestable faults which correspond to the same (relative) time flame. In this manner, the detection of the faults so identified would necessarily require that the selected circuit lead simultaneously assumed conflicting logic values at the starting time flame. Decision 76 determines if there are more circuit leads to select, and, finally, step 77 performs the automatic test generation (ATG) process on the original sequential circuit, explicitly excluding those faults which have been identified as untestable by the procedure of steps 71 through 76.

Steps 73 and 74 of the illustrative procedure of FIG. 8 may be performed with use of a sequential implication procedure which assigns uncontrollability and unobservability indicators to various circuit leads at the various time flames. Although conceptually similar to the illustrative implication procedure of FIG. 5, in the sequential case the implication procedure must handle flip-flop circuit elements and assign each of these indicators to specific time flames. Moreover, a sequential implication procedure must be able to make such assignments across time flame boundaries.

Figure 9:
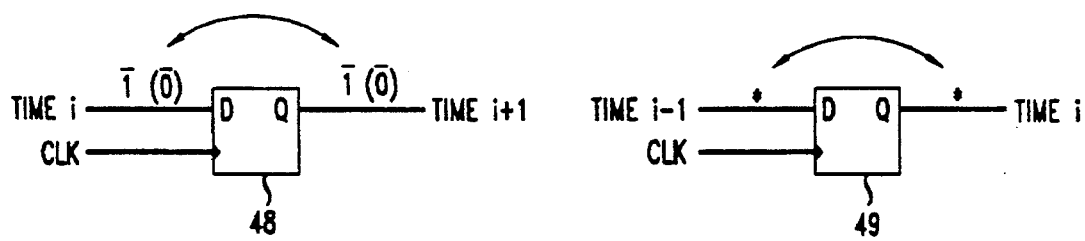
FIG. 9 shows illustrative rules for propagation of uncontrollability indicators and backward propagation of unobservability indicators through flip-flop circuit elements and across time frames.

FIG. 9 shows illustrative rules for propagation of uncontrollability indicators and backward propagation of unobservability indicators through flip-flop circuit elements. Specifically, "Flip-flop" 48 shows that when a flip-flop's data input is marked with a "$\overline{0}$" at a given time frame (e.g., time "i"), its ("Q") output may be marked with a "$\overline{0}$" at the next time frame (e.g., time "i+1"). Similarly, when a flip-flop's data input is marked with a "$\overline{1}$" at time "i," its output may be marked with a "$\overline{1}$" at time "i+1." Moreover, when a flip-flop's output is marked with a "$\overline{0}$" at time "i+1," its data input may be marked with a "$\overline{0}$" at time "i," and when a flip-flop's output is marked with a "$\overline{1}$" at time "i+1," its data input may be marked with a "$\overline{1}$" at time "i." These rules result from the fact that if a flip-flop's data input cannot be set to a given value at a given time frame, its output cannot be set to that value at the subsequent time frame, and vice versa. Regarding unobservability, "flip-flop" 49 shows that when a flip-flop's ("Q") output is marked with a "*" at a given time frame (e.g., time "i"), its data input may be marked with a "*" at the previous time frame (e.g., time "i–1"). That is, if a flip-flop's output is unobservable at a given time frame, its data input is unobservable at the previous time frame.

Figure 10:
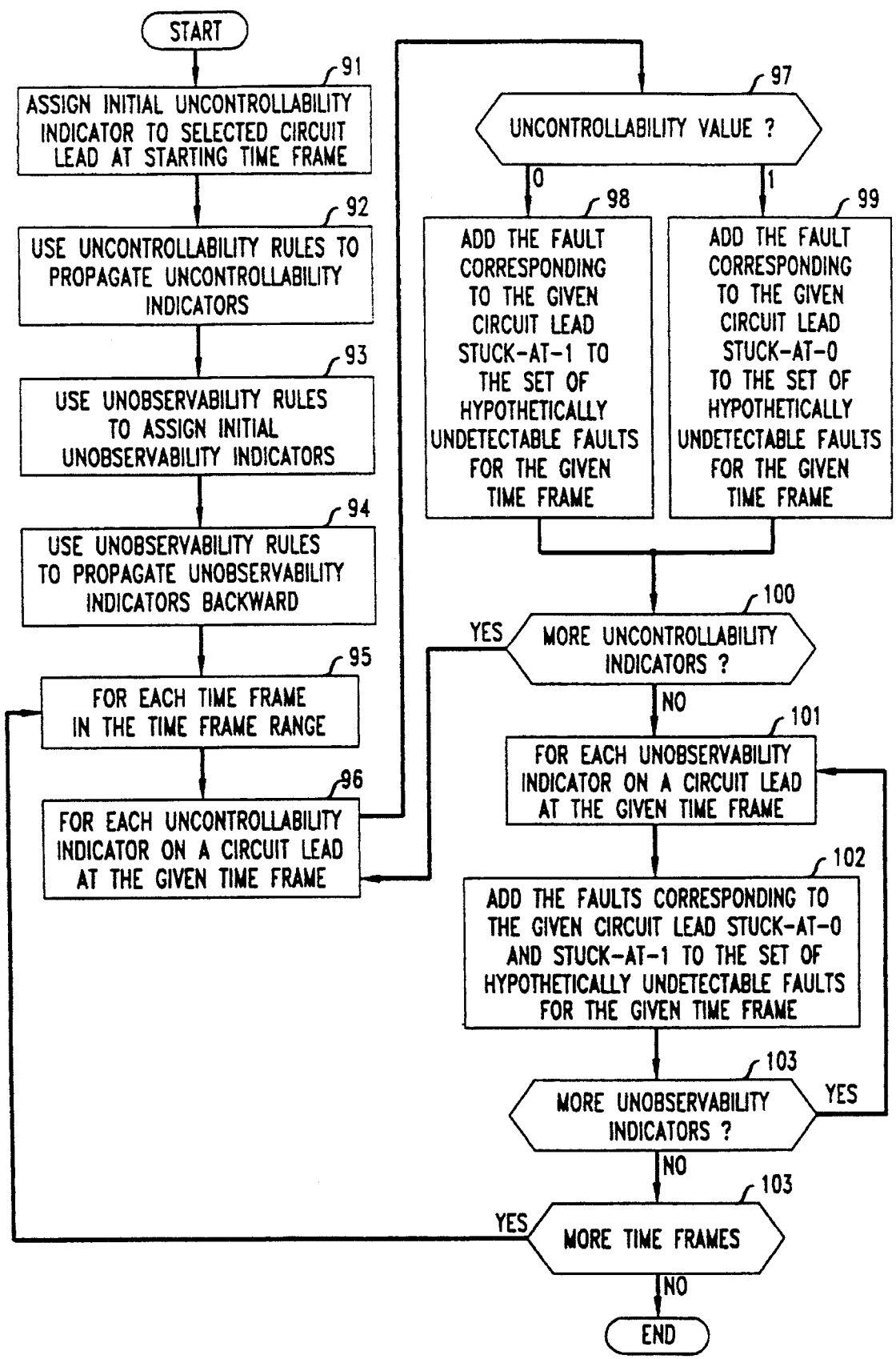
FIG. 10 shows a flowchart of an illustrative sequential implication procedure for use in the illustrative procedure of FIG. 8.

FIG. 10 shows a flowchart of an illustrative sequential implication procedure for use in steps 73 and 74 of the illustrative procedure of FIG. 8. Specifically, the procedure of FIG. 10 determines, for each time frame in the time frame range, a set of faults that would (hypothetically) be undetectable at that time frame if a given, selected circuit lead were uncontrollable to a specified value at the staffing time frame. This illustrative procedure may, for example, use propagation rules such as those shown in FIGS. 4 and 9 and described above.

Step 91 assigns an initial uncontrollability indicator to the selected circuit lead at the starting time frame (i.e., time frame "0"). This uncontrollability indicator marks the selected lead as uncontrollable to the specified logic value (0 or 1) depending on whether the procedure is being used to implement step 73 or step 74 of the procedure of FIG. 8. Next, step 92 uses predetermined uncontrollability indicator propagation rules (such as those shown on gates 41, 42 and 43 and circuit line fanout point 44 in FIG. 4, and on flip-flop 48 in FIG. 9) to propagate uncontrollability indicators through the circuit and across the various time flames within the time frame range. (Note that the propagation rule shown on flip-flop 48 in FIG. 9 will advantageously not be used if to do so would propagate an uncontrollability indicator to a time frame outside the time frame range.) Step 93 uses predetermined unobservability indicator creation rules (such as that shown on gate 47 in FIG. 4) to assign initial unobservability indicators to appropriate circuit leads. Step 94 then uses predetermined unobservability indicator propagation rules (such as those shown on gates 45 and 46 in FIG. 4 and on flip-flop 49 in FIG. 9) to propagate unobservability indicators backward through the circuit and backward across time frames within the time frame range. (Note that the propagation rule shown on flip-flop 49 in FIG. 9 will advantageously not be used if to do so would propagate an unobservability indicator to a time frame outside the time frame range.)

At this point, all circuit leads at all time frames (within the time frame range) which can be implied to be uncontrollable and/or unobservable from the initial uncontrollability assumption (based on the predetermined set of rules) have been so masked. Thus it only remains to deduce the hypothetically undetectable faults at each time frame which result from the markings appeasing on the various circuit leads at that time frame. In particular, these are the sets of faults that either cannot be activated or cannot be propagated at the particular time frame. The faults which (hypothetically) cannot be activated are the stuck-at-0 faults on leads which have been marked as uncontrollable to a logic 1 and the stuck-at-1 faults on leads which have been marked as uncontrollable to a logic 0. The faults which (hypothetically) cannot be propagated are both the stuck-at-0 and the stuck-at-1 faults on leads which have been marked as unobservable.

Thus, step 95 selects, in turn, each of the time frames in the analyzed time frame range, and step 96 then chooses each circuit lead which has been marked with an uncontrollability indicator at that time frame. Then, depending on the uncontrollability value with which it has been marked (as determined by decision 97), either the stuck-at-1 fault on that circuit lead (step 98) or the stuck-at-0 fault on that circuit lead (step 99) is added to the set of hypothetically undetectable faults for the given time frame. Decision 100 returns to step 96 to choose another such circuit lead until each uncontrollabilty indicator for the given time frame has been processed.

Similarly, step 101 chooses each circuit lead which has been marked with an unobservability indicator at the given time frame, and step 62 adds both the stuck-at-0 fault and the stuck-at-1 fault on that circuit lead to the set of hypothetically undetectable faults for the given time frame. Decision 103 returns to step 101 to choose another such circuit lead until each unobservability indicator for the given time frame has been processed.

When all uncontrollability and unobservability indicators for the given time frame have been processed, the set of hypothetically undetectable faults for that time frame is complete. Thus, decision 104 then returns to step 95 to process another time frame until all time frames in the time frame range have been processed, thereby producing a set of hypothetically undetectable faults for each time frame in the time frame range.

Figure 11:
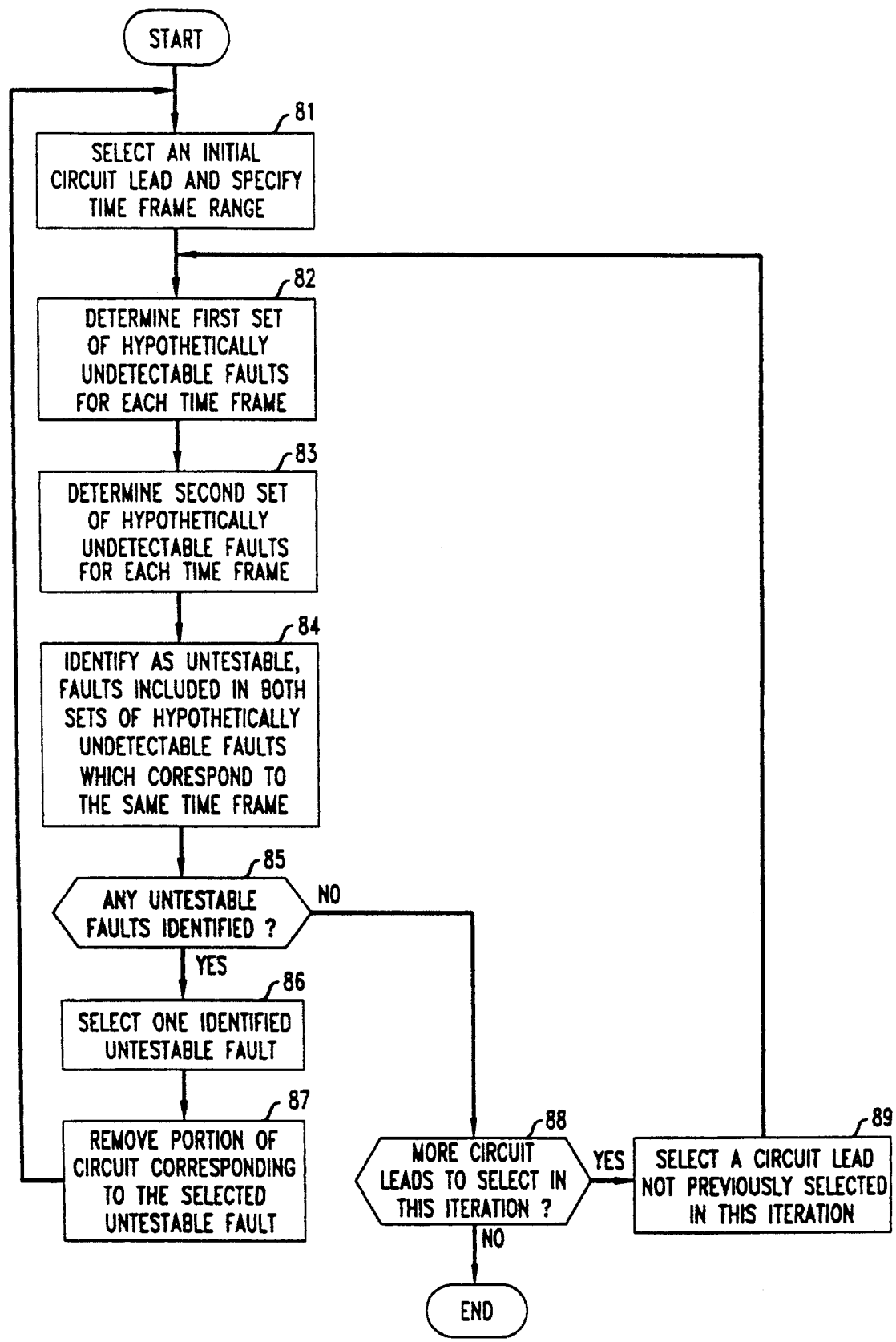
FIG. 11 shows a flowchart describing an additional illustrative embodiment of the method of the present invention wherein redundancy may be eliminated from a sequential circuit.

FIG. 11 shows a flowchart describing an additional illustrative embodiment of the method of the present invention wherein redundancy may be eliminated from a sequential circuit. Since the method of the present invention identifies faults in a sequential circuit which are not only untestable but, in fact, redundant, a sequential circuit may be simplified in accordance with one illustrative embodiment of the method of the present invention by iteratively identifying untestable/redundant faults and reducing the circuit design in accordance therewith. The resultant circuit will be smaller, but logically equivalent to, the original circuit. (Note that such a circuit reduction should advantageously be performed based on one identified untestable fault at a time, due to the fact that the removal of a portion of the circuit based on an untestable fault can affect the testability of other faults in the circuit.)

The illustrative redundancy elimination procedure of FIG. 11 identifies one untestable fault (at a time), removes the redundant portion of the circuit implied by the untestability of that fault, and then iterates this process until no more untestable faults are identified. Specifically, step 81 first selects for analysis an initial circuit lead from the given (current) version of the circuit and specifies a time frame range for analysis, thereby beginning a given iteration of the redundancy elimination procedure. Step 82 determines a plurality of first sets of hypothetically untestable faults, one set for each time frame, based on the assumption that the selected circuit lead could not, for example, be controlled to a logic 0 at the starting time frame. Similarly, step 83 determines a plurality of second sets of hypothetically untestable faults, one set for each time frame, based on the assumption that the selected circuit lead could not, for example, be controlled to a logic 1 at the starting time frame. Step 84 then identifies as untestable, faults included in both (first and second) sets of hypothetically untestable faults which correspond to the same time frame.

Decision 85 determines whether any faults have been identified as untestable in step 84, and if so, step 86 selects any one of these identified untestable faults. Step 87 then removes the portion of the circuit which can be determined to be redundant based on the untestability of the selected fault. For example, if a stuck-at-0 fault on a given circuit lead is an untestable fault, then all circuitry which feeds into the given circuit lead may be removed (to the extent that it does not feed into any other circuit leads which are not being removed), and the given circuit lead may be affixed to a logic 0 value (e.g., tied to ground). The selection of an untestable fault in step 86 may be made arbitrarily, or it may advantageously be based on the portion of the circuit that would be removed in step 87 based on its selection. (For example, untestable faults could advantageously be selected based on the quantity of circuitry that their selection would cause to be removed. In this manner, the efficiency of the redundancy elimination procedure may be improved.)

Note that certain portions of a sequential circuit which do not affect the behavior of the circuit after initialization are not redundant if they prevent the initialization of the circuit. Therefore, according to one illustrative embodiment of the present invention, the selected untestable fault may advantageously first be analyzed to ensure that the removal of the associated redundant circuitry will not result in an uninitializable circuit. This validation process may, for example, be carried out by checking the given node in each time frame to ensure that there is no time at which the node is uncontrollable to the faulty value. For example, if a stuck-at-1 on node "n" has been identified as a redundant and untestable fault by the method of the present invention, the circuit will not become uninitializable by the removal of the corresponding circuitry so long as node "n" does not appear as uncontrollable to a one in any of the time frames.

After step 87 has removed the redundant circuitry, a new iteration of the redundancy elimination procedure begins by returning to step 81. The new iteration will use the new version of the circuit as its current version.

If decision 85 determines that no faults have been identified in step 84, decision 88 determines whether there are more circuit leads to be analyzed (i.e., selected) within the given iteration (i.e., since the circuit was last modified by step 87). If so, step 89 selects a circuit lead which has not yet been selected within the given iteration and returns to step 82 in a further attempt to identify untestable faults in the current version of the circuit. If decision 88 determines that there are no more circuit leads to be analyzed within the given iteration, then an entire iteration of the procedure has been performed without identifying any untestable faults— that is, no untestable faults have been found in the current version of the circuit. Thus, the redundancy elimination procedure of FIG. 8 terminates, and the final version of the circuit may be adopted as logically equivalent to the original circuit design.

Although a number of specific embodiments of this invention have been shown and described herein, it is to be understood that these embodiments are merely illustrative of the many possible specific arrangements which can be devised in application of the principles of the invention. Numerous and varied other arrangements can be devised in accordance with these principles by those of ordinary skill in the art without departing from the spirit and scope of the invention. For example, although the above embodiments have been limited to logic circuits which operate based on a two-valued (binary) logic system comprising the values of logic 0 and logic 1, other embodiments may use logic systems based on three (ternary logic) or more values. In addition, techniques other than the implication procedure of FIG. 5 and the sequential implication procedure of FIG. 10 described above may be used to determine the set of faults which would be untestable if a given circuit lead were hypothetically uncontrollable to a given logic value. Moreover, although the above illustrative method of identifying untestable faults in sequential circuits has been described with reference to synchronous sequential circuits, other embodiments may be derived by those of ordinary skill in the art which, for example, apply the techniques of the present invention to asynchronous sequential circuits as well.

We claim:

1. A method of identifying untestable faults in a model of a sequential logic circuit, the model of the sequential logic circuit representing a sequential logic circuit comprising a plurality of circuit elements having one or more circuit leads and a plurality of circuit lines interconnecting the circuit leads of the circuit elements, the plurality of circuit elements including at least one flip-flop, each of the circuit leads able to assume one of a predetermined plurality of logic values at each of a plurality of time frames, the plurality of time frames including a starting time frame, the method comprising the steps of:

selecting one of the circuit leads of the sequential logic circuit;

determining a first set of faults, the first set of faults comprising faults which would be undetectable at a given one of the time frames if the selected circuit lead were unable to assume a first one of the predetermined plurality of logic values at the starting time frame;

determining a second set of faults, the second set of faults comprising faults which would be undetectable at the given time frame if the selected circuit lead were unable to assume a second one of the predetermined plurality of logic values at the starting time frame; and identifying as untestable faults one or more faults included in both the first set of faults and the second set of faults.

2. The method of claim I wherein the selected circuit lead comprises a stem of a circuit line having reconvergent fanout.

3. The method of claim 1 wherein the selected circuit lead comprises a reconvergent input of a reconvergent circuit element.

4. The method of claim 1 wherein the step of determining the first set of faults corresponding to the first logic value and the step of determining the second set of faults corresponding to the second logic value each comprises a sequential implication procedure, the implication procedure comprising the steps of:

assigning to the selected circuit lead at the starting time frame an initial uncontrollability indicator, the initial uncontrollability indicator hypothesizing that the selected circuit lead cannot assume the corresponding one of the first logic value and the second logic value at the starting time frame;

assigning uncontrollability indicators to selected circuit leads at associated time frames by propagating the initial uncontrollability indicator through the model of the logic circuit according to a predetermined set of uncontrollability propagation rules, the uncontrollability indicators hypothesizing that the selected circuit leads cannot assume an identified one of the logic values at the corresponding one of the associated time frames;

assigning initial unobservability indicators to selected circuit leads at associated time frames based on the assigned uncontrollability indicators and the time frames associated therewith, the unobservability indicators hypothesizing that the value assumed by the selected circuit lead cannot be observed at the corresponding one of the associated time frames;

assigning additional unobservability indicators to selected circuit leads at associated time frames by propagating the initial unobservability indicators backward through the model of the logic circuit according to a predetermined set of unobservability propagation rules, the unobservability indicators hypothesizing that the value assumed by the selected circuit lead cannot be observed at the corresponding one of the associated time frames;

selecting one of the time frames; and determining the set of faults based on the uncontrollability indicators and the unobservability indicators which are associated with the selected time frame and their corresponding circuit leads.

5. An automated method of generating a test for a sequential logic circuit based on a model thereof, the sequential logic circuit comprising a plurality of circuit elements having one or more circuit leads and a plurality of circuit lines interconnecting the circuit leads of the circuit elements, the plurality of circuit elements including at least one flip-flop, each of the circuit leads able to assume one of a predetermined plurality of logic values at each of a plurality of time frames, the plurality of time frames including a starting time frame, the method comprising the steps of:

selecting one of the circuit leads of the sequential logic circuit;

determining a first set of faults, the first set of faults comprising faults which would be undetectable at a given one of the time frames if the selected circuit lead were unable to assume a first one of the predetermined plurality of logic values at the starting time frame;

determining a second set of faults, the second set of faults comprising faults which would be undetectable at the given time frame if the selected circuit lead were unable to assume a second one of the predetermined plurality of logic values at the starting time frame;

identifying as untestable faults one or more faults included in both the first set of faults and the second set of faults; and generating the test based on one or more faults which have not been identified as untestable faults.

6. The method of claim 5 wherein the selected circuit lead comprises a stem of a circuit line having reconvergent fanout.

7. The method of claim 5 wherein the selected circuit lead comprises a reconvergent input of a reconvergent circuit element.

8. The method of claim 5 wherein the step of determining the first set of faults corresponding to the first logic value and the step of determining the second set of faults corresponding to the second logic value each comprises a sequential implication procedure, the implication procedure comprising the steps of:

assigning to the selected circuit lead at the starting time frame an initial uncontrollability indicator, the initial uncontrollability indicator hypothesizing that the selected circuit lead cannot assume the corresponding one of the first logic value and the second logic value at the starting time frame;

assigning uncontrollability indicators to selected circuit leads at associated time frames by propagating the initial uncontrollability indicator through the model of the logic circuit according to a predetermined set of uncontrollability propagation rules, the uncontrollability indicators hypothesizing that the selected circuit leads cannot assume an identified one of the logic values at the corresponding one of the associated time frames;

assigning initial unobservability indicators to selected circuit leads at associated time frames based on the assigned uncontrollability indicators and the time frames associated therewith, the unobservability indicators hypothesizing that the value assumed by the selected circuit lead cannot be observed at the corresponding one of the associated time frames;

assigning additional unobservability indicators to selected circuit leads at associated time frames by propagating the initial unobservability indicators backward through the model of the logic circuit according to a predetermined set of unobservability propagation rules, the unobservability indicators hypothesizing that the value assumed by the selected circuit lead cannot be observed at the corresponding one of the associated time frames;

selecting one of the time frames; and determining the set of faults based on the uncontrollability indicators and the unobservability indicators which are associated with the selected time frame and their corresponding circuit leads.

9. A method of testing a fabricated logic circuit with use of an automatically generated test, the test generated based on a model of the fabricated logic circuit, the test comprising a circuit stimulus and a corresponding expected circuit response, the logic circuit comprising a plurality of circuit elements having one or more circuit leads and a plurality of circuit lines interconnecting the circuit leads of the circuit elements, the plurality of circuit elements including at least one flip-flop, each of the circuit leads able to assume one of a predetermined plurality of logic values at each of a plurality of time frames, the plurality of time frames including a starting time frame, the method comprising the steps of:

selecting one of the circuit leads of the logic circuit;

determining a first set of faults, the first set of faults comprising faults which would be undetectable at a given one of the time frames if the selected circuit lead were unable to assume a first one of the predetermined plurality of logic values at the starting time frame;

determining a second set of faults, the second set of faults comprising faults which would be undetectable at the given time frame if the selected circuit lead were unable to assume a second one of the predetermined plurality of logic values at the starting time frame;

identifying as untestable faults one or more faults included in both the first set of faults and the second set of faults;

generating the test based on one or more faults which have not been identified as untestable faults;

applying the generated circuit stimulus to the fabricated logic circuit;

measuring a circuit response from the fabricated logic circuit; and determining whether the circuit response from the fabricated logic circuit differs from the generated expected circuit response corresponding to the generated circuit stimuli.

10. The method of claim 9 wherein the selected circuit lead comprises a stem of a circuit line having reconvergent fanout.

11. The method of claim 9 wherein the selected circuit lead comprises a reconvergent input of a reconvergent circuit element.

12. The method of claim 9 wherein the step of determining the first set of faults corresponding to the first logic value and the step of determining the second set of faults corresponding to the second logic value each comprises a sequential implication procedure, the implication procedure comprising the steps of:

assigning to the selected circuit lead at the starting time frame an initial uncontrollability indicator, the initial uncontrollability indicator hypothesizing that the selected circuit lead cannot assume the corresponding one of the first logic value and the second logic value at the starting time frame;

assigning uncontrollability indicators to selected circuit leads at associated time frames by propagating the initial uncontrollability indicator through the model of the logic circuit according to a predetermined set of uncontrollability propagation rules, the uncontrollability indicators hypothesizing that the selected circuit leads cannot assume an identified one of the logic values at the corresponding one of the associated time frames;

assigning initial unobservability indicators to selected circuit leads at associated time frames based on the assigned uncontrollability indicators and the time frames associated therewith, the unobservability indicators hypothesizing that the value assumed by the selected circuit lead cannot be observed at the corresponding one of the associated time frames;

assigning additional unobservability indicators to selected circuit leads at associated time frames by propagating the initial unobservability indicators backward through the model of the logic circuit according to a predetermined set of unobservability propagation rules, the unobservability indicators hypothesizing that the value assumed by the selected circuit lead cannot be observed at the corresponding one of the associated time frames;

selecting one of the time frames; and determining the set of faults based on the uncontrollability indicators and the unobservability indicators which are associated with the selected time frame and their corresponding circuit leads.

13. A method of testing a fabricated logic circuit with use of an automatically generated test, the test based on a model of the fabricated logic circuit, the test comprising a circuit stimulus and a corresponding expected circuit response, the logic circuit comprising a plurality of circuit elements having one or more circuit leads and a plurality of circuit lines interconnecting the circuit leads of the circuit elements, the plurality of circuit elements including at least one flip-flop, each of the circuit leads able to assume one of a predetermined plurality of logic values at each of a plurality of time frames, the plurality of time frames including a starting time frame, the test having been generated by:

selecting one of the circuit leads of the logic circuit;

determining a first set of faults, the first set of faults comprising faults which would be undetectable at a given one of the time frames if the selected circuit lead were unable to assume a first one of the predetermined plurality of logic values at the starting time frame;

determining a second set of faults, the second set of faults comprising faults which would be undetectable at the given time frame if the selected circuit lead were unable to assume a second one of the predetermined plurality of logic values at the starting time frame;

identifying as untestable faults one or more faults included in both the first set of faults and the second set of faults; and generating the test based on one or more faults which have not been identified as untestable faults, the method comprising the steps of:

applying the generated circuit stimulus to the fabricated logic circuit;

measuring a circuit response from the fabricated logic circuit; and determining whether the circuit response from the fabricated logic circuit differs from the generated expected circuit response corresponding to the generated circuit stimuli.

14. The method of claim 13 wherein the selected circuit lead comprises a stem of a circuit line having reconvergent fanout.

15. The method of claim 13 wherein the selected circuit lead comprises a reconvergent input of a reconvergent circuit element.

16. The method of claim 13 wherein the step of determining the first set of faults corresponding to the first logic value and the step of determining the second set of faults corresponding to the second logic value each comprises a sequential implication procedure, the implication procedure comprising the steps of:

assigning to the selected circuit lead at the starting time frame an initial uncontrollability indicator, the initial uncontrollability indicator hypothesizing that the selected circuit lead cannot assume the corresponding one of the first logic value and the second logic value at the starting time frame;

assigning uncontrollability indicators to selected circuit leads at associated time frames by propagating the initial uncontrollability indicator through the model of the logic circuit according to a predetermined set of uncontrollability propagation rules, the uncontrollability indicators hypothesizing that the selected circuit leads cannot assume an identified one of the logic values at the corresponding one of the associated time frames;

assigning initial unobservability indicators to selected circuit leads at associated time frames based on the assigned uncontrollability indicators and the time frames associated therewith, the unobservability indicators hypothesizing that the value assumed by the selected circuit lead cannot be observed at the corresponding one of the associated time frames;

assigning additional unobservability indicators to selected circuit leads at associated time flames by propagating the initial unobservability indicators backward through the model of the logic circuit according to a predetermined set of unobservability propagation rules, the unobservability indicators hypothesizing that the value assumed by the selected circuit lead cannot be observed at the corresponding one of the associated time frames;

selecting one of the time frames; and determining the set of faults based on the uncontrollability indicators and the unobservability indicators which are associated with the selected time frame and their corresponding circuit leads.

17. A method of modifying a sequential logic circuit design to remove logical redundancy, the sequential logic circuit design representing a circuit comprising a plurality of circuit elements having one or more circuit leads and a plurality of circuit lines interconnecting the circuit leads of the circuit elements, the plurality of circuit elements including at least one flip-flop, each of the circuit leads able to assume one of a predetermined plurality of logic values at each of a plurality of time frames, the plurality of time frames including a starting time frame, the method comprising the steps of:

selecting one of the circuit leads of the circuit;

determining a first set of faults, the first set of faults comprising faults which would be undetectable at a given one of the time frames if the selected circuit lead were unable to assume a first one of the predetermined plurality of logic values at the starting time frame;

determining a second set of faults, the second set of faults comprising faults which would be undetectable at the given time frame if the selected circuit lead were unable to assume a second one of the predetermined plurality of logic values at the starting time frame;

identifying as untestable faults one or more faults included in both the first set of faults and the second set of faults;

selecting one of the identified untestable faults; and modifying the sequential logic circuit design by removing a selected portion thereof, the selected portion determined based on the selected identified untestable fault.

18. The method of claim 17 wherein the selected circuit lead comprises a stem of a circuit line having reconvergent fanout.

19. The method of claim 17 wherein the selected circuit lead comprises a reconvergent input of a reconvergent circuit element.

20. The method of claim 17 wherein the step of determining the first set of faults corresponding to the first logic value and the step of determining the second set of faults corresponding to the second logic value each comprises a sequential implication procedure, the implication procedure comprising the steps of:

assigning to the selected circuit lead at the starting time frame an initial uncontrollability indicator, the initial uncontrollability indicator hypothesizing that the selected circuit lead cannot assume the corresponding one of the first logic value and the second logic value at the starting time frame;

assigning uncontrollability indicators to selected circuit leads at associated time frames by propagating the initial uncontrollability indicator through the model of the logic circuit according to a predetermined set of uncontrollability propagation rules, the uncontrollability indicators hypothesizing that the selected circuit leads cannot assume an identified one of the logic values at the corresponding one of the associated time frames;

assigning initial unobservability indicators to selected circuit leads at associated time frames based on the assigned uncontrollability indicators and the time frames associated therewith, the unobservability indicators hypothesizing that the value assumed by the selected circuit lead cannot be observed at the corresponding one of the associated time frames;

assigning additional unobservability indicators to selected circuit leads at associated time frames by propagating the initial unobservability indicators backward through the model of the logic circuit according to a predetermined set of unobservability propagation rules, the unobservability indicators hypothesizing that the value assumed by the selected circuit lead cannot be observed at the corresponding one of the associated time frames;

selecting one of the time frames; and determining the set of faults based on the uncontrollability indicators and the unobservability indicators which are associated with the selected time frame and their corresponding circuit leads.

21. A method of fabricating a logic circuit based on an initial logic circuit design, the initial logic circuit design representing an initial circuit comprising a plurality of circuit elements having one or more circuit leads and a plurality of circuit lines interconnecting the circuit leads of the circuit elements, the plurality of circuit elements including at least one flip-flop, each of the circuit leads able to assume one of a predetermined plurality of logic values at each of a plurality of time frames, the plurality of time frames including a starting time frame, the method comprising the steps of:

selecting one of the circuit leads of the initial circuit;

determining a first set of faults, the first set of faults comprising faults which would be undetectable at a given one of the time frames if the selected circuit lead were unable to assume a first one of the predetermined plurality of logic values at the starting time frame;

determining a second set of faults, the second set of faults comprising faults which would be undetectable at the given time frame if the selected circuit lead were unable to assume a second one of the predetermined plurality of logic values at the starting time frame;

identifying as untestable faults one or more faults included in both the first set of faults and the second set of faults;

selecting one of the identified untestable faults;

modifying the initial logic circuit design to produce a modified circuit design by removing a selected portion of the initial logic circuit design, the selected portion determined based on the selected identified untestable fault; and fabricating the logic circuit based on the modified circuit design.

22. The method of claim 21 wherein the selected circuit lead comprises a stem of a circuit line having reconvergent fanout.

23. The method of claim 21 wherein the selected circuit lead comprises a reconvergent input of a reconvergent circuit element.

24. The method of claim 21 wherein the step of determining the first set of faults corresponding to the first logic value and the step of determining the second set of faults corresponding to the second logic value each comprises a sequential implication procedure, the implication procedure comprising the steps of:

assigning to the selected circuit lead at the starting time frame an initial uncontrollability indicator, the initial uncontrollability indicator hypothesizing that the selected circuit lead cannot assume the corresponding one of the first logic value and the second logic value at the starting time frame;

assigning uncontrollability indicators to selected circuit leads at associated time frames by propagating the initial uncontrollability indicator through the model of the logic circuit according to a predetermined set of uncontrollability propagation rules, the uncontrollability indicators hypothesizing that the selected circuit leads cannot assume an identified one of the logic values at the corresponding one of the associated time frames;

assigning initial unobservability indicators to selected circuit leads at associated time frames based on the assigned uncontrollability indicators and the time frames associated therewith, the unobservability indicators hypothesizing that the value assumed by the selected circuit lead cannot be observed at the corresponding one of the associated time frames;

assigning additional unobservability indicators to selected circuit leads at associated time frames by propagating the initial unobservability indicators backward through the model of the logic circuit according to a predetermined set of unobservability propagation rules, the unobservability indicators hypothesizing that the value assumed by the selected circuit lead cannot be observed at the corresponding one of the associated time frames;

selecting one of the time frames; and determining the set of faults based on the uncontrollability indicators and the unobservability indicators which are associated with the selected time frame and their corresponding circuit leads.

* * * * *